United States Patent [19]

Russell

[11] Patent Number: 5,521,426
[45] Date of Patent: May 28, 1996

[54] REDUCED CAPACITANCE LEAD FRAME FOR LEAD ON CHIP PACKAGE

[75] Inventor: Ernest J. Russell, Richmond, Tex.

[73] Assignee: Texas Instruments Incorporated, Dallas, Tex.

[21] Appl. No.: 333,126

[22] Filed: Nov. 1, 1994

Related U.S. Application Data

[63] Continuation of Ser. No. 158,719, Nov. 29, 1993, abandoned, which is a continuation of Ser. No. 942,538, Sep. 9, 1992, abandoned.

[51] Int. Cl.⁶ .................................................. H01L 23/495
[52] U.S. Cl. ............................................ 257/666; 257/676
[58] Field of Search ..................................... 257/666, 667, 257/668, 669, 670, 671, 672, 673, 674, 675, 676

[56] References Cited

U.S. PATENT DOCUMENTS 4,987,474  1/1991  Yasuhara et al. ..................... 257/674
5,198,883  3/1993  Takahashi et al. ..................... 257/673

FOREIGN PATENT DOCUMENTS

| 0405871A2 | 2/1991 | European Pat. Off. . |
| 0405871A3 | 2/1991 | European Pat. Off. . |
| 56-004260 | 1/1981 | Japan . |
| 63-015455 | 1/1988 | Japan . |
| 01071161  | 3/1989 | Japan . |

*Primary Examiner*—Sara W. Crane
*Assistant Examiner*—S. V. Clark
*Attorney, Agent, or Firm*—Richard L. Donaldson; Leo N. Heiting; William W. Holloway

[57] ABSTRACT

In a lead on chip, LOC, integrated circuit packaging arrangement, the conductors terminate in fingers that receive the bond wires. Adjacent the fingers, the conductors have arm parts extending over the major face of the integrated circuit. These arm parts are formed by stamping, rolling or otherwise to present an upwardly opening channel with at least the bottom lateral margins of the arm part raised above the plane of the bottom surface of the arm part. This reduces sagging of the arm part and capacitive interaction with the integrated circuit.

12 Claims, 2 Drawing Sheets

ID OF THE INVENTION

This invention relates to lead frames used for connecting electrical signals to packaged integrated circuits and particularly relates to where the lead frames extend over the integrated circuits, also known as lead on chip or LOC.

DESCRIPTION OF THE RELATED ART

Present packaging techniques for megabit dynamic random access memory DRAM devices mount the ends or fingers of the lead frame conductors, which extend over a major face of the integrated circuit chip, to the chip with a small piece of double sided adhesive tape. The bond pads on the chip extend along the central longitudinal axis of the chip. The lead frame presents two conductors, used as power rails or busses, extending the length of the chip and adhesively mounted proximate the bond pads, one on each side of the bond pads. These two conductors carry power to the chip and conduct heat from the chip. Other lead frame conductors present arms bent and extending inwardly from opposed sides of the package or chip. The arms terminate in the fingers mounted proximate their related bond pad on a side of the power rails opposite the bond pads. Some of the bond wires then extend from certain of the bond pads to the respective power rails. The rest of the bond wires loop over the power rails to connect respective bond pads to lead frame conductor fingers.

U.S. Pat. No. 5,068,712 to Murakami, et al., U.S. Pat. No. 4,916,519 to Ward and U.S. Pat. No. 4,862,245 to Pashby, et al. disclose this packaging technique.

The arms extending over the chip and terminating in the fingers have been long, flat and narrow metal formations. By extending over the chip, some capacitive interaction occurs between the signals on the chip, or the voltage applied to the chip substrate, and the signal carried by the arm of each conductor. Some efforts at reducing this capacitive interaction center around reducing the width of the conductor arm, because capacitance relates generally to the area of the arm exposed to the underlying chip. An undesired result of narrowing the arm is the arm bowing or sagging toward and possibly touching the chip.

U.S. Pat. No. 5,068,712 particularly overcomes problems related to stray capacity, signal transmission rate and electrical noises by a certain arrangement of the gap between the leading end portions of the inner leads and the semiconductor chip.

SUMMARY OF THE INVENTION

A lead on chip, LOC, packaging arrangement includes lead frame conductors having long, narrow and flat arms that terminate in fingers. The fingers adhesively mount over a major face of the integrated circuit and receive bond wires extending from bond pads centrally located on the integrated circuit. The conductor arms have parts adjacent the fingers that are bent or formed into longitudinal formations different from the cross-sectional shape of the rest of the arm to increase the strength of the arm part against bowing or sagging. Particularly the arm parts are formed into upwardly opening channels. Along the length of these channels, at least the lower margins of the conductor material are raised to be above the plane of the lower surface of the arm part. This formation not only strengthens the conductor arm parts against bending or sagging, but also reduces the capacitive interaction between the conductor arm parts and the underlying integrated circuit chip.

The arm parts can be formed by stamping, rolling or otherwise to effect the channel structure. Typically the material of the lateral margins of each arm part will be displaced upwardly from the remaining central material of the arm part. This increases the distance between the lateral margins of the arm part and the underlying chip to reduce the capacitive interaction, while obtaining the structural strength of a channel formation. This also effectively reduces the area of the arm part that lies close to the chip to substantially only the central material of the arm part to reduce the capacitance.

DESCRIPTION OF THE PREFERRED EMBODIMENT

Figure 1:
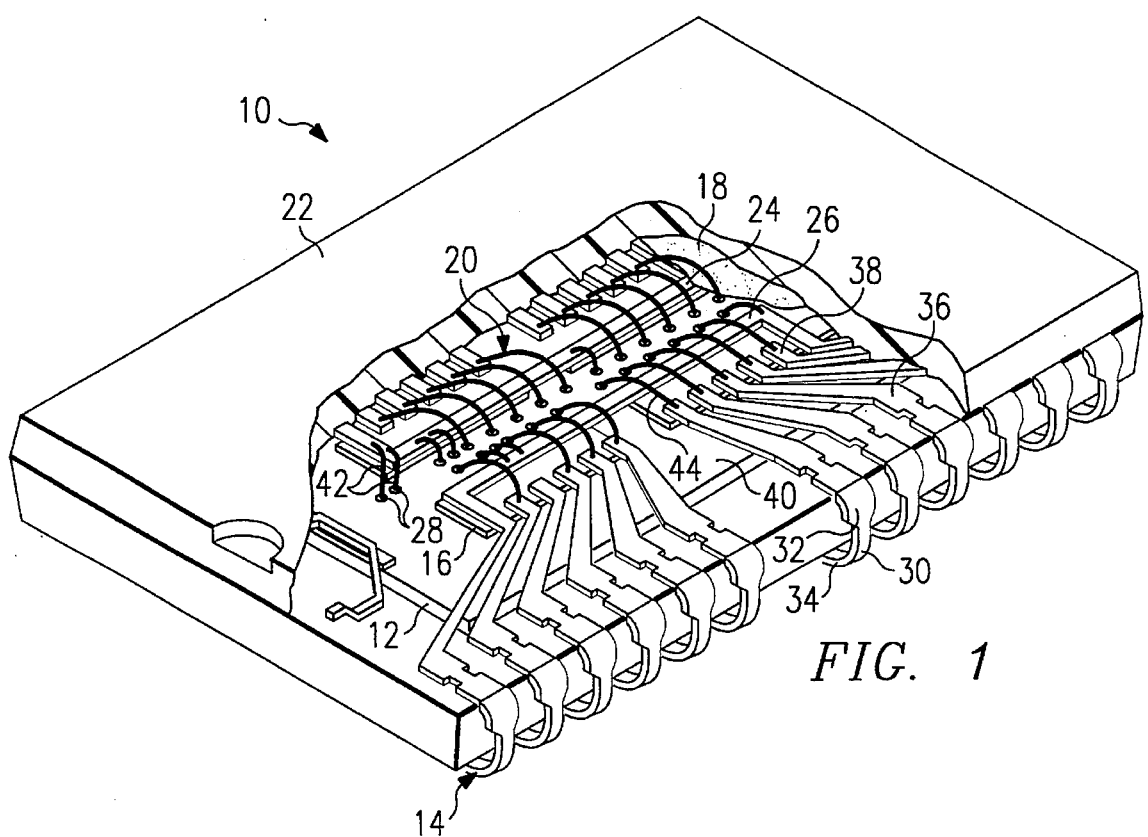
FIG. 1 is a perspective view of an integrated circuit chip packaged in a LOC arrangement, with part of the encapsulating material removed to expose the chip and lead frame parts.

In FIG. 1, packaged integrated circuit device 10 comprises integrated circuit chip 12, conductors 14 forming a lead frame, adhesive tapes 16 adhesively mounting the conductors 14 on the integrated circuit chip 12, soft packaging material 18 overlying the area of the device containing the bond wires 20 and hard packaging material 22 encapsulating the entire device.

The packaging arrangement depicted in FIG. 1 forms a small outline J lead, or SOJ, package. Chip 12 can be any type of integrated circuit desired and in the preferred embodiment is a dynamic random access memory, DRAM, chip of the so-called 16 megabit size having $2^{24}$ or 16,777, 216 memory cells.

Two of the conductors 14 have parts 24 and 26 that extend the length of the chip and are used as power rails or buses. The bond pads 28 on the chip extend along the central longitudinal axis of the chip and the power rail or bus parts 24 and 26 mount proximate to the bond pads, one on each side. These two conductor parts carry power to the chip and conduct heat away from the chip.

The other lead frame conductors 14 such as conductor 30 present a flat body portion 32, a long and narrow depending leg 34 that is bent under the package in the shape of a "J" and is adapted to be connected to an electrical connector on a printed circuit board. Conductor 30 also presents a long arm 36 bent inwardly from a side of the package and extending over the chip 12 to terminate in finger 38. Arm 36 and finger 38 extend across and lie over a major face 40 of the chip 12. The fingers of all the conductors 14 mount on the adhesive tapes 16 proximate the power rails or buses 24 and 26 and on a side of the power rails or buses opposite the bond pads 28. Some of the bond wires 20 such as bond wires 42 extend from the bond pads 28 to the power rail or bus part 24. Others of the bond wires 20 such as bond wire 44 loop over the top of the conductor part 26 and attach to the top surface of the finger 38. This arrangement of the lead frame conductors, the adhesive tapes 16 and the lead frame conductors 14 is known as a lead over chip or LOC arrangement.

Figure 2:
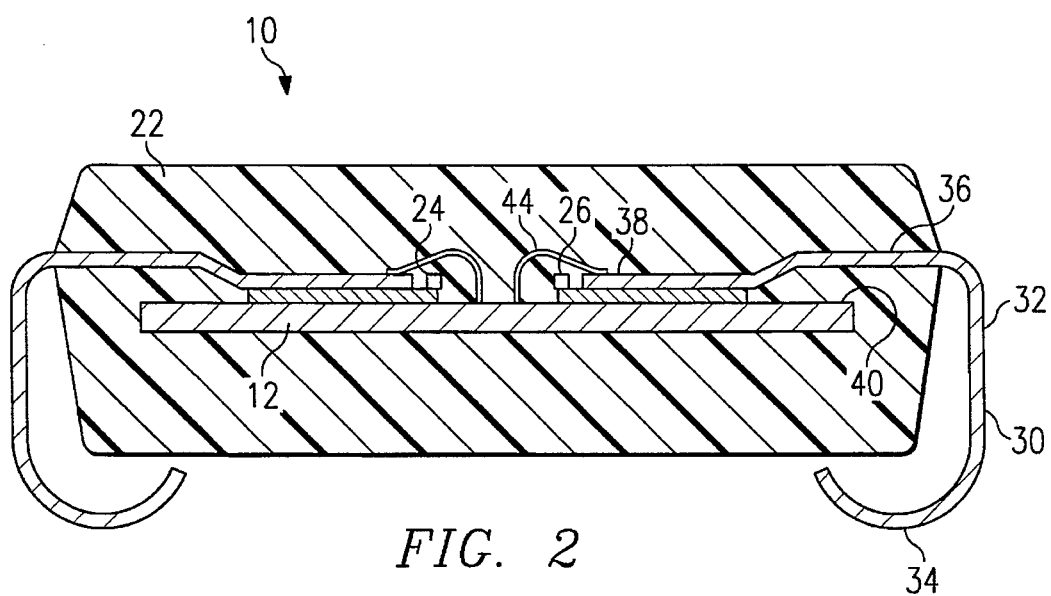
FIG. 2 is a transverse cross-sectional view of the packaged integrated circuit of FIG. 1.

In FIG. 2, the conductor arm 36 extends over the major face 40 of the integrated circuit chip 12 and terminates in finger 38. Whenever a lead frame conductor is routed over the surface of an integrated circuit chip, the operation of the chip and conductor is hampered by the resulting capacitance between the two. Designers prefer a minimum amount of capacitance to exist between these conductors and chips and a guideline of a two picofarad (2 pF) capacitance maximum has been established. Due to the large size of chips required to provide the over 16 million bits of information, the lengths of the conductor arms and fingers overlying the chips has become longer. In order to reduce the effective capacitance, these long runs of conductive material are being designed to be narrower. This causes a problem in making the conductor very flimsy and subject to bowing or sagging under its own weight, which occurs when reaching the limit on the minimum material width.

Figure 3:
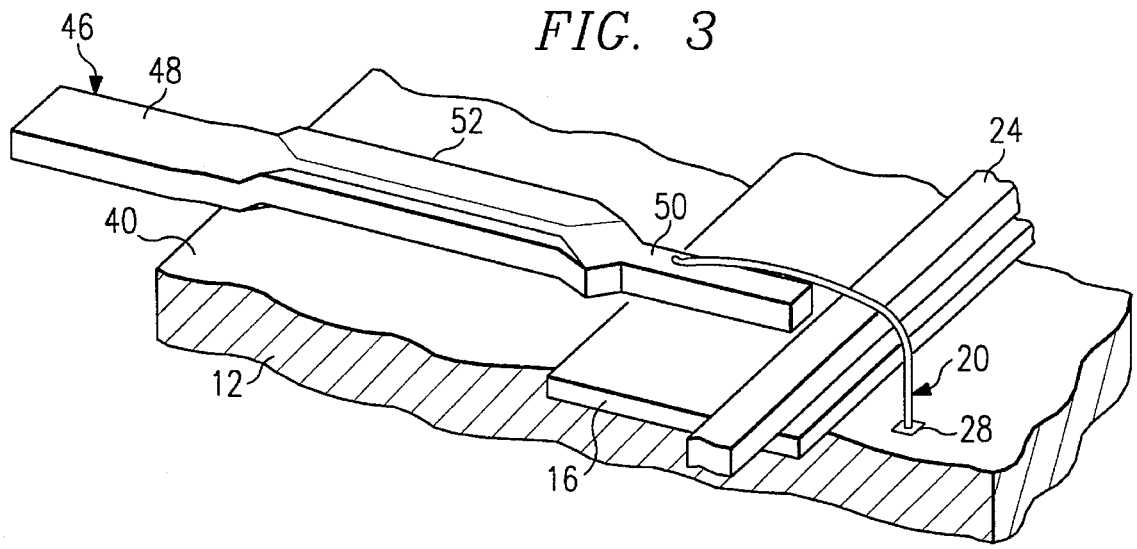
FIG. 3 is an enlarged idealized perspective view of a lead frame adhesively mounted over a chip and including a representative bond wire.

In FIG. 3, lead frame conductor 46 includes a rectangular cross-section arm 48 terminating in finger 50. A part 52 of arm 48 adjacent finger 50 and overlying chip 12 is specially formed to have a cross-sectional shape different from the rectangular shape of arm 48 to strengthen arm 48 and to reduce the capacitive interaction between the arm part 52 and the integrated circuit chip 12.

Figure 4:
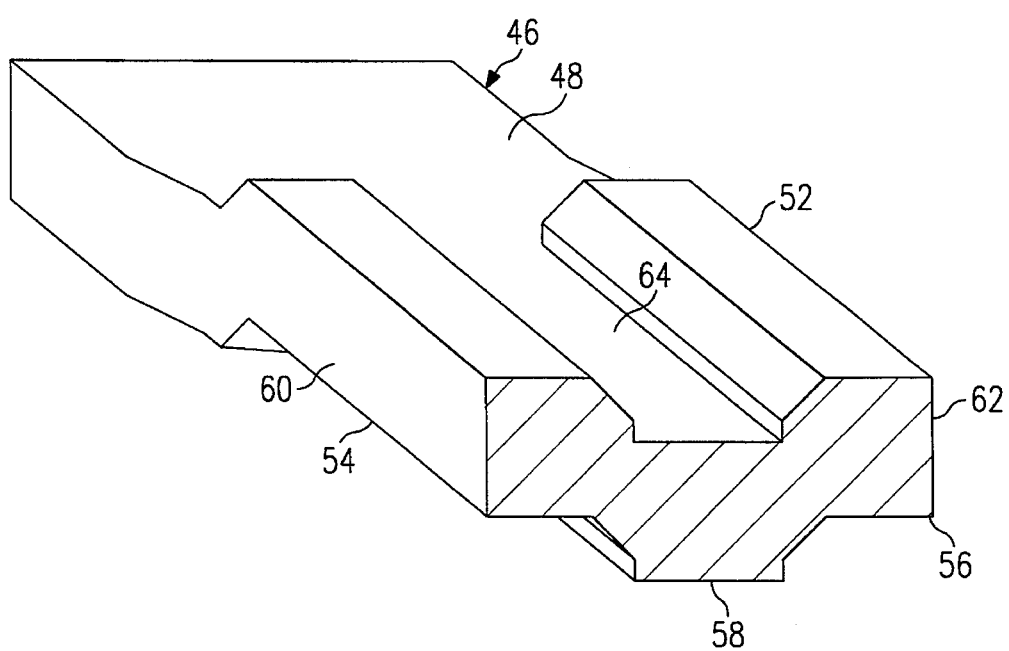
FIG. 4 is an enlarged idealized perspective view of a lead frame conductor arm part cut in transverse section to exhibit the channel feature of the invention.

Referring also to FIG. 4, arm part 52 is formed generally in a channel or an upwardly opening "U" configuration. The lower lateral margins 54 and 56 of the part 52 are raised above the plane of the bottom surface 58 of the arm part to strengthen the arm from bending. Because the width of bottom surface 58 is less than the width of the rectangular arm 48, there is less material proximate the major face 40 of the integrated circuit chip 12, and there is less capacitive interaction between the arm 48 and the integrated circuit chip 12.

The embodiment depicted in FIGS. 3 and 4 displaces the material of both lateral margins 60 and 62 upwardly relative to the central material 64 of the arm part 52. In one embodiment, the material of arm 48 has a thickness of about 0.008". The lower lateral margins 54 and 56 are raised about 0.003" above the bottom surface 58. The central material 64 has a width of about 0.008" and the arm 48 has a width of about 0.023". Typically the lead frame conductor 46 is made of a material known as alloy 42 comprising iron and nickel.

With this channel formation in the arm part 52, the conductor 46 attains an I-beam effect to strengthen the arm part against any bowing or sagging. Also the elevated lower lateral margins present less capacitance to the chip than the middle section. This obtains a better handling of the long arm portion mechanically while remaining within electrical capacitance parameters.

Modifications and variations of the invention are possible in light of the above teachings while remaining within the scope of the appended claims. The lead frame material can vary as well as the specific dimensions identified. Other cross-sectional shapes also can be used to obtain strength and reduce capacitance. Moreover, the arm part 52 can be formed by any process desired such as by stamping, rolling or otherwise. Additionally, only one of the lateral margins may be formed to be displaced from the other lateral margin to result in an L or V shape.

I claim:

1. A lead frame conductor for electrical connection to an integrated circuit chip, the conductor comprising:

A. an elongate body formed of conductive material;

B. an elongate leg depending from the body and adapted to be connected to an electrical conductor on a printed circuit board; and C. an elongate arm, having a certain cross-section shape and width, extending from the body opposite the leg and terminating in a finger adapted to be connected to one end of a bond wire, the bond wire having an opposite end connected to a bond pad of an integrated circuit, the arm having a longitudinal part adjacent the finger adapted to overlie a major face of the integrated circuit and be subject to capacitive interaction with the integrated circuit, the longitudinal arm part having a downwardly extending projection with a lower surface having a width less than the width of the arm part, a cross-section of the arm part defining an upwardly opening channel, the arm part presenting at least one lower lateral margin raised above the plane part of a bottom wall of the arm; and said elongate body, said elongate leg, and said elongate arm being a unitary structure.

2. The conductor of claim 1 in which the lateral margins of the arm part are formed upwardly of the plane of the rest of the material of the arm part.

3. The conductor of claim 1 in which both the lower lateral margins of the arm part are formed to present an upwardly opening channel formed of contiguous side and bottom walls.

4. The conductor of claim 1 in which the arm and the finger present substantially flat side and bottom walls, the arm part presents a substantially flat lower wall which is parallel with the bottom wall of the finger, the arm part has at least one lateral margin raised above the lower wall of the arm part, and the lateral margin having a substantially flat bottom wall parallel to the lower wall of the arm part.

5. The integrated circuit of claim 1 in which the bond pads are centrally located down the longitudinal axis of the integrated circuit and the lead frame conductor has two long buses running adjacent to the bond pads.

6. The conductor of claim 5 in which the conductor is attached to the integrated circuit by tape having a width equal to the area in which the buses and the finger rest on the integrated circuit.

7. A lead frame for electrical coupling to an integrated circuit package, the lead frame comprising:

a plurality of lead frame conductors, each lead frame conductor of the type described in claim 3.

8. The lead frame of claim 7, said integrated circuit package including a linear group of bond pads, said lead frame further comprising:

a bus positioned adjacent to said bond pads.

9. The lead frame of claim 8 wherein said lead frame is coupled to said integrated circuit package by a tape, said tape mechanically coupled to said integrated circuit package, said tape mechanically coupled to said bus and said fingers.

10. An electronic circuit comprising:

an integrated circuit package including a plurality of bond pads and an integrated circuit, said bond pads electrically coupled to said integrated circuit;

an electrical component a lead frame electrically coupled to said electrical component, said lead frame including a plurality of lead frame conductors as defined by claim 3; and conducting wires for electrically coupling lead frame conductors with associated bonding pads.

11. The electronic circuit of claim 10 wherein said bond pads are arranged in a linear configuration, said lead frame including a bus positioned adjacent said group of bonding pads.

12. The electronic circuit of claim 11 further including a tape, said tape coupled to said integrated circuit package and coupled to said bus and said fingers.

\* \* \* \* \*